United States Patent [19]
Leeson et al.

[11] Patent Number: 5,804,894
[45] Date of Patent: Sep. 8, 1998

[54] LOW VOLTAGE BATTERY PACK MONITORING CIRCUIT WITH ADJUSTABLE SET POINTS

[75] Inventors: Randal A. Leeson, Stow; Richard Shoobridge, Akron, both of Ohio

[73] Assignee: Telxon Corporation, Akron, Ohio

[21] Appl. No.: 699,093

[22] Filed: Aug. 16, 1996

[51] Int. Cl.$^6$ .............................. H01H 35/00; H02J 7/00
[52] U.S. Cl. ..................... 307/130; 307/150; 320/106; 320/134; 320/135
[58] Field of Search .................................. 307/112, 116, 307/125, 130, 126, 150; 320/1, 2, 5, 14, 27, 29, 48, 49, 106, 127, 134, 135, 136

[56] References Cited

U.S. PATENT DOCUMENTS

| | | | |
|---|---|---|---|
| 5,541,490 | 7/1996 | Sengutpa et al. | 320/14 |
| 5,633,573 | 5/1997 | Van Phuoc et al. | 320/5 |
| 5,666,040 | 9/1997 | Bourbeau | 320/6 |

Primary Examiner—William M. Shoop, Jr.
Assistant Examiner—Jonathan S. Kaplan
Attorney, Agent, or Firm—Watts, Hoffman, Fisher & Heinke Co., LPA

[57] ABSTRACT

A low voltage battery pack monitoring circuit for a battery powered electronic device is disclosed. The circuit utilizes low battery and power failure set point voltages and first and second comparison circuits to compare voltage across the device battery pack to the set point voltages. If the battery pack output voltage falls below the low battery pack set point voltages, the first comparison circuit sends a signal to a microprocessor causing a low battery indicator light to be actuated. If the battery pack output voltage continues to decrease below the power failure set point voltage, the second comparison circuit includes a comparator which changes output state and turns off selected electronic systems of the device and the device enters a suspend mode. The low battery pack set point voltage value and the power failure set point voltage value are determined using an empirical look up table.

20 Claims, 6 Drawing Sheets

Fig.1 TIME DURING WHICH POWER IS SUPPLIED BY BATTERY PACK

| DESIRED WARNING TIME (MIN) | BATTERY TEMP | BATTERY CELL QUALITY | POWER CONSUMPTION RATE | V LOWBATT (V) | V LOWBATT (V) |
|---|---|---|---|---|---|
| 5 10 15 | LOW LOW LOW | GOOD GOOD GOOD | LOW LOW LOW | 6.5 6.6 6.7 | 6.4 6.4 6.4 |
| 5 10 15 | MEDIUM MEDIUM MEDIUM | GOOD GOOD GOOD | LOW LOW LOW | 6.2 6.3 6.4 | 6.0 6.0 6.0 |
| 5 10 15 | HIGH HIGH HIGH | GOOD GOOD GOOD | LOW LOW LOW | 6.0 6.05 6.1 | 5.8 5.8 5.8 |
| ... | ... | ... | ... | ... | ... |
| 5 10 15 | LOW LOW LOW | FAIR FAIR FAIR | MEDIUM MEDIUM MEDIUM | 6.6 6.7 6.8 | 6.4 6.4 6.4 |
| ... | ... | ... | ... | ... | ... |
| 5 10 15 | HIGH HIGH HIGH | POOR POOR POOR | HIGH HIGH HIGH | 6.8 6.9 7.0 | 6.5 6.5 6.5 |

Fig.5 ent invention relates to a low voltage battery pack monitoring circuit for a portable electronic device and, more particularly, to a low voltage battery pack monitoring circuit which provides for dynamically adjustable low battery and power failure voltage set points and which provides for substantially instantaneous shut down of selected device electronic systems if the output voltage of the device battery pack falls below the power failure set point voltage.

BACKGROUND OF THE INVENTION

Portable electronic devices such as laptop computers and hand held dataform readers are normally powered by a rechargeable battery pack which is received in an opening in the device's housing. The battery pack typically includes one or more rechargeable battery cells comprised of nickel-cadmium (Ni-Cd), lithium-ion (Li-Ion) or nickel-metal hydroxide (sometimes referred to as nickel-metal hydride) (Ni-MH).

When a fully charged battery pack is inserted into the device and the device is operated, power is drained from the pack Referring to FIG. 1, at a time $t=t_{lowbatt}$, the output voltage of the battery pack has decreased from full charge voltage, $V_{fullcharge}$, to a voltage level referred to as a low battery pack output voltage, $V_{lowbatt}$. At $V_{lowbatt}$, while the device is still operable, a replacement battery pack will be required shortly for continued operation of the device. If the device continues to be used the output voltage of the battery pack will continue to decline. At time $t=t_{failure}$ the battery pack output voltage will decrease to a level referred to as a failure threshold voltage $V_{failure}$. At battery pack output voltages below $V_{failure}$, power regulation circuitry of the device cannot provide adequate voltage to maintain volatile memory of the device and stored data in memory may be lost. At time $t=t_{failure}$ it is necessary for the device to change to a reduced level of operation referred to as the suspend mode. In the suspend mode electronic systems of the device which consume relatively large amounts of power, e.g., communications circuitry, illumination system for bar code dataform imaging, a backlight for a visual display screen, etc. are turned off. Further, since it is necessary to provide sufficient power to the volatile memory to avoid loss of data, power must be provided to the memory from the remaining power in the battery pack and/or a back up power source in the device.

Typical portable electronic devices which operate on battery power include a battery monitoring circuit which: (1) notifies the operator when the battery pack output voltage, $V_{batt}$, falls below a $V_{lowbatt}$ set point voltage; and (2) puts the device into the suspend mode when the battery pack output voltage, $V_{batt}$, falls below a $V_{failure}$ set point voltage to reduce power consumption to a memory preserving minimum. Current battery monitoring circuits operate by monitoring the voltage across the terminals of the battery pack. The $V_{batt}$ voltage is compared to a predetermined $V_{lowbatt}$ set point voltage and $V_{batt}<V_{lowbatt}$, the monitoring circuitry provides a signal to the device's microprocessor which executes programming code. As a result of execution of the code, a signal is generated by the microprocessor which activates a low battery display light and/or sounds an audible alarm and/or flashes a message on a display screen providing notification to the operator that the battery pack power is low. The $V_{lowbatt}$ set point voltage value may be determined from the voltage across a backup power supply in the device. When the voltage across the main battery pack drops to the voltage across the backup battery pack, the monitoring circuitry generates the low battery signal.

When $V_{batt}$ drops below the predetermined $V_{failure}$ set point voltage, the monitoring circuitry provides a signal to the microprocessor which executes programming code to put the device into the suspend mode. The predetermined $V_{failure}$ set point voltage is set at a voltage value above the minimum necessary value for avoiding data loss in volatile memory.

One problem associated with the present monitoring circuits is that an operator of the device cannot control and does not know the operating time of the device between triggering the $V_{lowbatt}$ set point voltage and falling to the $V_{failure}$ set point voltage. For example, if the operator is operating the device at a remote location and does not have a spare battery pack, he or she may want to perform a certain task which will require five minutes of device operation time before returning to a facility where a replacement battery pack is available. With current monitoring circuits, the operator does not know if the device can be operated for those five minutes to complete the task. If the task is started and the battery pack voltages falls below $V_{failure}$, the device will enter the suspend mode forcing the operator to leave the work area to obtain a replacement battery pack. Upon returning to the work area the operator will likely have to start the task over from the beginning because of the interruption. Another disadvantage of present monitoring circuits is they do not permit dynamic adjustment of the $V_{lowbatt}$ and $V_{failure}$ set point voltages on the basis of such variables as the quality of the battery cells comprising the battery pack, the temperature of the battery cells and power consumption characteristics of the planned use of the device.

Yet another problem with present monitoring circuits is that after the circuit generates a signal indicating that $V_{batt}<V_{failure}$, the device microprocessor must execute programming code to put the device into the suspend mode. Execution of the code requires time and if the drop of $V_{bat}$ is sudden (the battery pack is removed from the device or suffers catastrophic failure), the entry into suspend mode may be too slow to avoid some loss of data in volatile memory.

SUMMARY OF THE INVENTION

A low voltage battery pack monitoring circuit for a portable electronic device is disclosed. The monitoring circuit provides dynamically adjustable set point voltages for $V_{lowbatt}$, low battery pack output, and $V_{failure}$, battery pack power failure condition. The monitoring circuit utilizes the device's microprocessor to determine the $V_{lowbatt}$ and $V_{failure}$ set points based on a combination of variables including battery cell quality, battery temperature, power consumption characteristics of the device and desired operator time between low battery and power failure conditions, i.e., the time period between $V_{lowbatt}$ and $V_{failure}$.

In one embodiment of the monitoring circuitry of the present invention, upon determination by the microprocessor, a digital representation of the $V_{Lowbatt}$ and $V_{failure}$ set point voltages is stored in respective registers. The digital representations are coupled to respective digital to analog converters (D/A converters) to convert the set point voltages to analog values. The battery pack output voltage, $V_{batt}$, is input to an inverting input of a first comparator and a noninverting input of a second comparator. The analog representation of $V_{lowbatt}$ is input to a noninverting input of the first comparator and an analog representation of $V_{failure}$ is input to the inverting input of the second comparator.

The first comparator compares $V_{batt}$ to $V_{lowbatt}$ and if $V_{batt}<V_{lowbatt}$, the first comparator changes output state. The output of the first comparator is coupled to the microprocessor. Upon the change in output state of the first comparator, the microprocessor generates a signal which actuates an LED indicator for a predetermined time to notify the operator of a low battery output voltage condition.

The second comparator compares $V_{batt}$ to $V_{failure}$ and if $V_{lowbatt}<V_{failure}$, the second comparator changes output state. The output of the second comparator is coupled to a reset input of one or more D flip-flops. The Q output of each of the D flip flops, in turn, is coupled to a respective switch. Each switch is connected to a different electronic system of the device which is relatively high power consuming system, e.g., communications circuitry, illumination module, display screen backlight, etc. Upon the second comparator changing output, each D flip-flop is reset and the Q output of each D flip-flop changes state (from high output to low output). When the Q outputs of the D flip-flops change state, the switches coupled thereto turn off and the electronic systems coupled to the switches also turn off. The second comparator is also coupled to a switch between a back up power supply (a rechargeable battery) and memory of the device.

When $V_{batt}<V_{failure}$ and the second comparator changes output state, the switch coupling the back up power supply and the memory is turned on thereby providing sufficient power to avoid data loss by the memory. The output of the second comparator may also coupled to the microprocessor which, upon sensing the change in output state of the comparator, executes code stored in memory and takes whatever actions are programmed in the code to cause other systems of the device to shut down or operate other systems at reduce power consumption level.

Because the output state of the second comparator changes state substantially instantaneously upon $V_{batt}$ falling below $V_{failure}$ and since the second comparator is directly coupled through a switch to the back up power supply switch and, through the D flip-flops and coupled switches, to the selected high power consumption electronic systems, the device effectively begins to enter the suspend mode instantaneously upon $V_{batt}$ falling below $V_{failure}$ and does not require execution of programming code by the microprocessor to begin to enter the power saving suspend mode.

These and other advantages and features of this invention will be clearly understood through consideration of the following detailed description of the invention in conjunction with the accompanying drawings.

BRIEF DESCRIPTION OF THE DRAWINGS

FIG. 5 is an exemplary empirically derived look up table for determination of $V_{lowbatt}$ and $V_{failure}$ set point voltage values by a microprocessor of the device.

DETAILED DESCRIPTION

Figure 1:
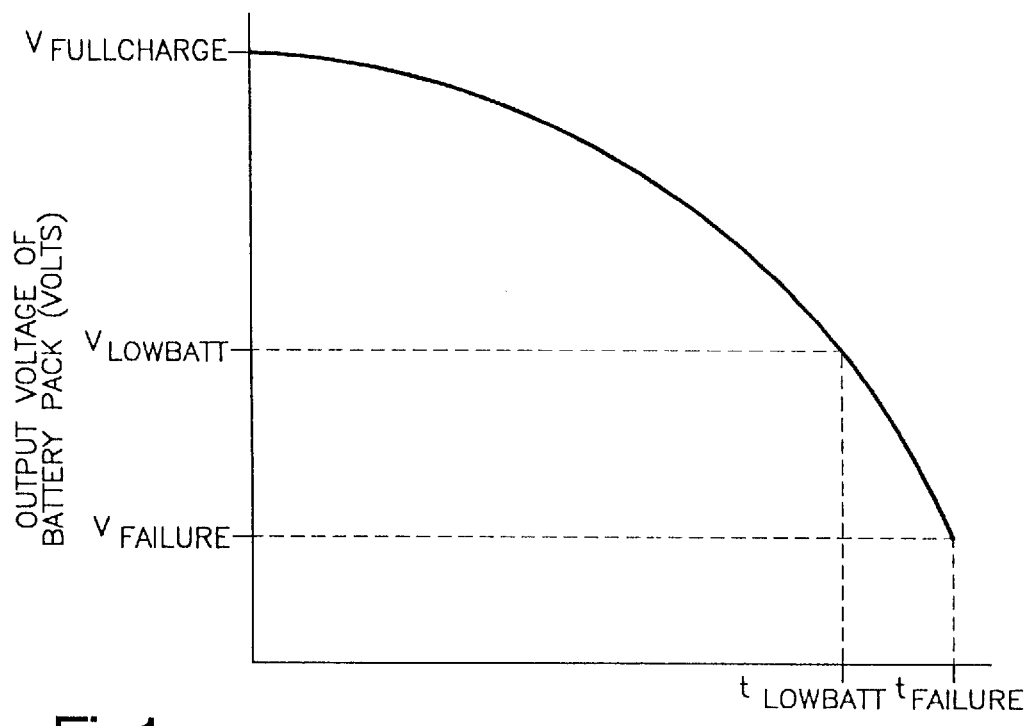
FIG. 1 is a graph plotting battery pack voltage as a function of time for a battery pack used to operate an electronic device.
Figure 2:
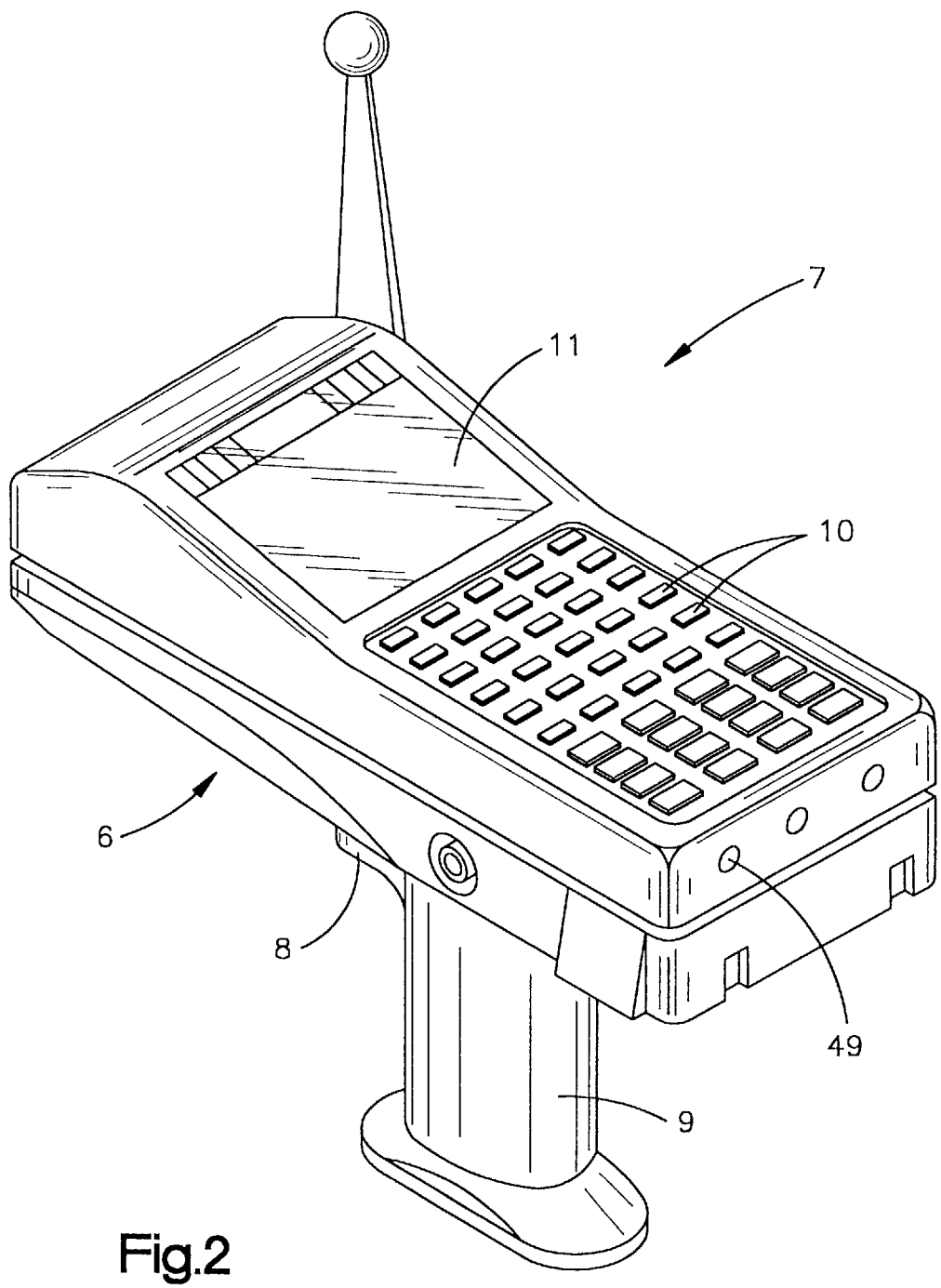
FIG. 2 is a perspective view of a typical electronic device in which a low voltage battery pack monitoring circuit of the present invention is disposed.
Figure 3:
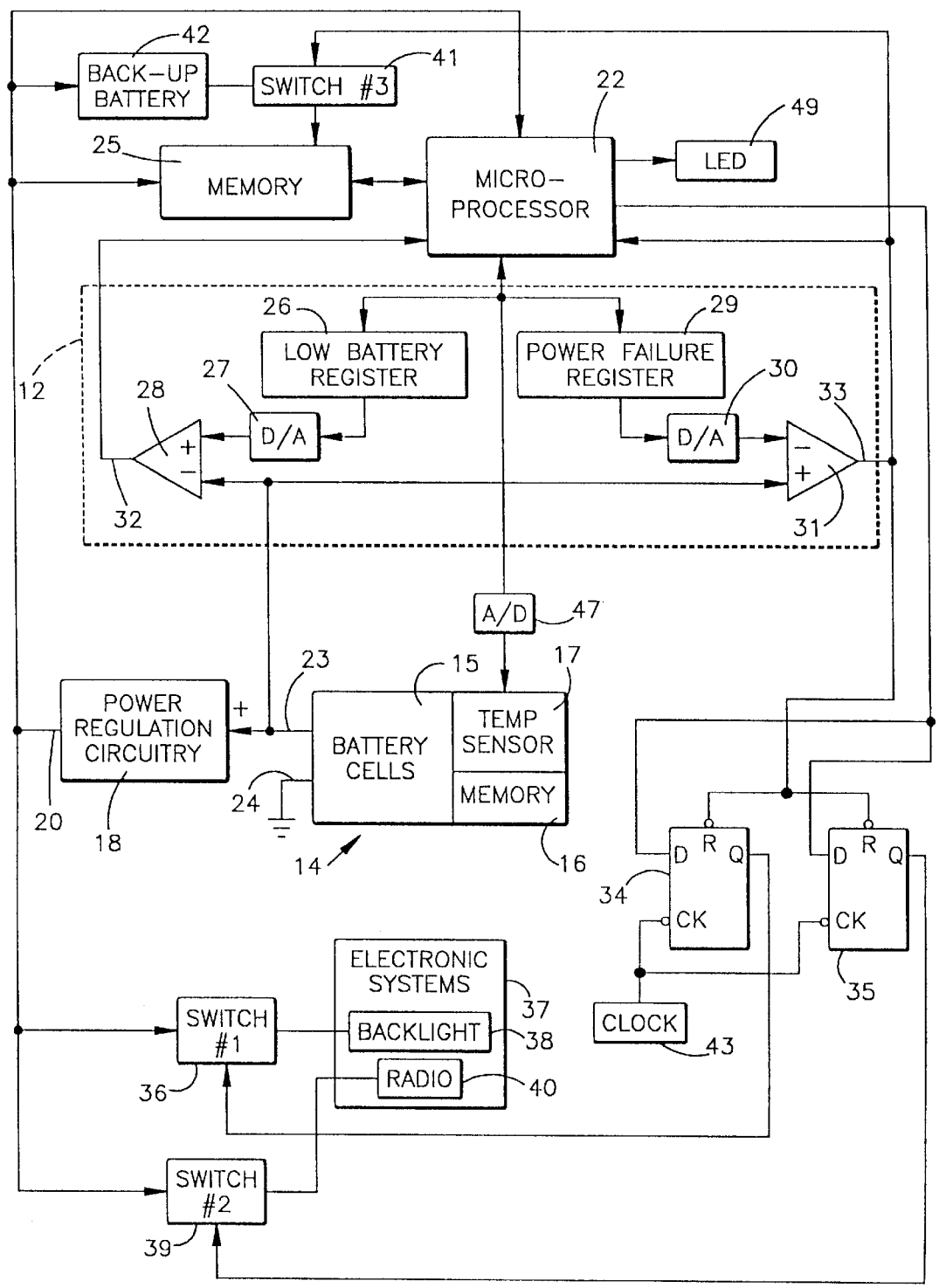
FIG. 3 is a schematic block diagram of the low voltage battery pack monitoring circuit of the present invention and selected other circuitry of the electronic device.

One embodiment of low voltage battery pack monitoring circuitry of the present invention is shown schematically within a box labeled 12 in FIG. 3. The monitoring circuitry 12 is disposed, along with other electronic circuitry and electronic systems in an interior region of a housing 6 of a portable data collection device 7 shown in FIG. 2. While the portable data collection device 6 includes a bar code dataform reading assembly actuated by a trigger 8, it should be appreciated that the monitoring circuitry 12 of the present invention is suitable for any portable electronic device and is not limited to use in the device 6 depicted in FIG. 2.

The electronic circuitry and systems of the device 7 is powered by a battery pack 14 disposed in a handle portion 9 of the housing 6. The battery pack 14 includes a plurality of electrically coupled rechargeable battery cells 15 and also includes a digital memory 16 and a temperature sensing circuit 17. A suitable battery pack having a memory and a temperature sensing circuit is described in U.S. patent application Ser. No. 08/319,301, filed Oct. 6, 1994 and entitled "Battery System Including Data Storage Memory." Application Ser. No. 08/319,301 is incorporated herein in its entirety by reference. The power output by the battery pack 14 is coupled to power regulation circuitry 18. The power regulation circuitry 18, in turn, provides appropriate regulated power to all electronic circuitry and systems of the electronic device 7 via a bus 20.

A microprocessor 22 controls operations of the device 7 and interfaces with an operator though the trigger 8, a keypad 10 and an interactive touch sensitive visual display screen 11. As will be explained below, the microprocessor 22 utilizes an empirical look up table to determine: a) an appropriate set point voltage, $V_{lowbatt}$, at which a low battery pack power indication is triggered if the output voltage, $V_{batt}$, across positive and negative terminals 23, 24 of the battery pack 14; and b) an appropriate power failure set point voltage, $V_{failure}$, at which the device 7 enters a suspend mode. At $V_{lowbatt}$, the device 7 is still operable but the operator is alerted that a replacement battery pack will be required shortly for continued operation of the device. If the device continues to be operated $V_{batt}$ will continue to decline. When $V_{batt}$ falls below $V_{failure}$ the power regulation circuitry 18 of the device 7 cannot provide adequate voltage to maintain volatile portion of a memory 25 of the device and stored data in the memory may be lost. An analog to digital (A/D) converter 47 is coupled between the temperature sensing circuitry 17 and the microprocessor 22 to digitize the analog temperature value output by the temperature sensing circuitry.

The monitoring circuitry 12 includes a first or low battery pack comparison circuit and a second or power failure comparison circuit. The first comparison circuit includes a first or low battery register 26, a first digital to analog (D/A) converter 27 and a first or low battery comparator 28. The second comparison circuit includes a second or power failure register 29, a second D/A converter 30 and a second or power failure comparator 31.

A digital representation of the $V_{lowbatt}$ and $V_{failure}$ set point voltage values are stored in the low battery and power failure registers 26, 29 of the monitoring circuitry 12. The digital $V_{lowbatt}$ set point voltage value from the low battery register 26 is input to the first D/A converter 27 which generates an analog $V_{lowbatt}$ value. The $V_{lowbatt}$ value, in turn, is input to a noninverting input of the first comparator 28. Similarly, the digital $V_{failure}$ set point voltage value from the power failure register 29 is input to the second D/A converter 30 which generates an analog $V_{failure}$ value. The $V_{failure}$ value, in turn, is input to an inverting input of the second comparator 31.

An output 32 of the first comparator 28 is electrically coupled to the microprocessor 22 while the output 33 of the second comparator 31 is electrically coupled reset inputs of first and second D flip-flops 34, 35. The Q output of the first D flip-flop 34 is electrically coupled to a first switch 36 which, when closed, connects regulated power from the power regulation circuitry 18 to energize one or more selected high power consuming electronic systems 37 of the device 7. In this particular case, the first switch 36 is electrically coupled to a backlight illumination system 38 of the visual display screen 11. The Q output of the second D flip-flop 35 is electrically coupled to a second switch 39 which, when closed, energizes another high power consuming electronic system, in this case, a radio transceiver system 40.

Typical examples of high power consuming electronic systems of the portable data collection device 7 would include the backlight illumination system 38 for the visual display screen 11, an illumination module for the dataform reading assembly, communications circuitry including the radio transceiver 40, etc. The output 33 of the second comparator 39 is also coupled to a third switch 41. The third switch 41 couples a back up power supply in the form of a rechargeable battery 42 to the memory 25. By closing the third switch 47, the battery 42 will provide sufficient power to maintain the memory 40 for a limited time. The back up battery 42 is charged by the power regulation circuitry 18 when the power pack 14 is sufficiently charged such that $V_{batt} > V_{lowbatt}$. The output 33 of the second comparator 31 is also electrically coupled to the microprocessor 22.

The first comparator 28 compares $V_{lowbatt}$ to the unregulated voltage, $V_{batt}$, across the battery pack 14. When $V_{batt} < V_{lowbatt}$, the output 32 of the first comparator 28 changes state and goes high. The microprocessor 22 senses the change in state of the first comparator 28 and executes programming associated with a low battery condition which results in actuation of a light emitting diode 49 for a predetermined time and flashing of a low battery message on the display screen 11 for a predetermined time to notify the operator than a low battery pack voltage output condition has been reached.

If the device 7 continues to be operated, $V_{batt}$ will continue to decrease and at some point $V_{batt} < V_{failure}$. If the battery pack 14 is removed from the handle portion 9 of the housing 6 or if the battery pack 14 suffers catastrophic failure, $V_{batt}$ will abruptly fall below $V_{failure}$. In any event, when $V_{batt} < V_{failure}$, the output 33 of the second comparator 31 changes state and goes low. The change in output state 33 of the second comparator 31 is opposite the change in output state 32 of the first comparator 28 because, in the case of the first comparator 28, $V_{batt}$ is coupled to the inverting input of the comparator while in the case of the second comparator 31, $V_{batt}$ is coupled to the noninverting input of the comparator. The selected electronic systems 34 coupled to the output 44 of the second comparator 39 are turned off because the low output 33 of the second comparator 31 resets the D flip-flops 34, 35 causing the respective Q outputs to go low thereby turning off the first and second switches 36, 39 which cuts power from the power regulation circuitry 18 to the backlight illumination system 38 and the radio transceiver 40.

It should be appreciated that additional D flip-flops may be added to the illustrative example shown in FIG. 3 to turn off other high power consuming electronic systems as desired. It should also be noted that the D inputs to the D flip-flops 34, 35 are electrically coupled to the microprocessor 22. Thus, the microprocessor 22 could change the Q output state of either or both of the D flip-flops 34, 35 to turn off either or both of the backlight illumination system 28 and the radio transceiver 40. However, since the outputs of the second comparison circuit, the D flip-flops 34, 35 and the first and second switches 36, 39 are hardware driven, that is, they do not depend on the microprocessor 22 executing code, the turning off of the selected electronic systems 37 is nearly instantaneous upon $V_{batt} < V_{failure}$ and the microprocessor's execution of suspend mode code is not required to put the device 7 into a power saving or suspend mode. Also input to clock input CK of the D flip-flops is an appropriate clocking signal generated by register write strobe logic 43.

The output 33 of the second comparator 31 is directly coupled to the third switch 41. When the second comparator output 33 goes low, the third switch 41 thereby coupling power from the back up battery 42 to the memory 25 (and any other volatile memory of the device 7). Also, the output 33 of the second comparator 31 is coupled to the microprocessor 22. The microprocessor 22 senses the change in output state 33 of the second comparator 31 going from high to low and executes code to either turn off or reduces operations to a power saving minimum. Thus, changing state of the second comparator 31 causes the device 7 to enter the suspend mode of operation.

Figure 4:
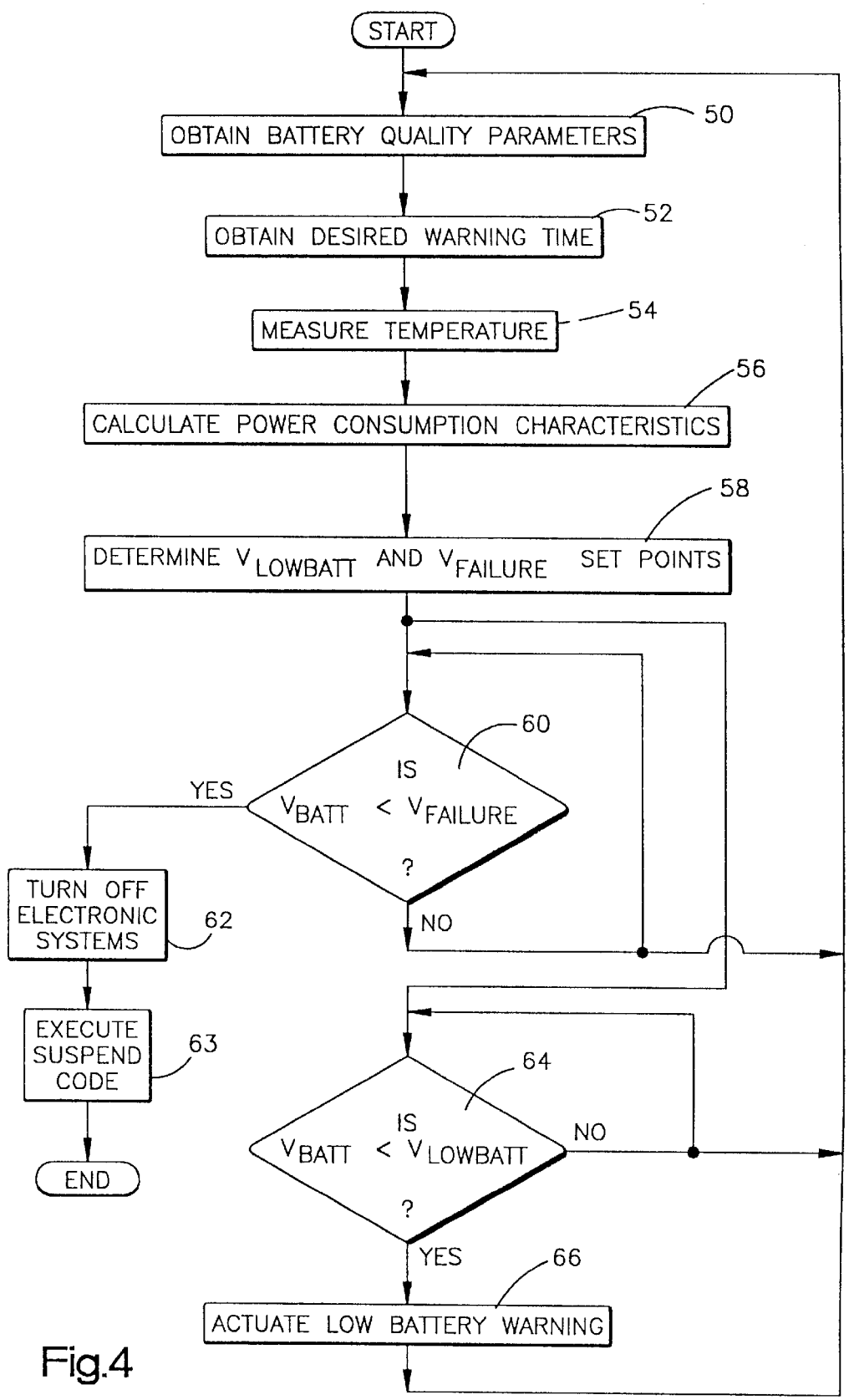
FIG. 4 is a flow chart illustrating a process of setting low voltage and power failure set points for the low voltage battery pack detection circuit.

FIG. 4 is a flowchart of the battery pack monitoring process of the present invention. To determine the $V_{lowbatt}$ and $V_{failure}$ set point voltage values, at step 50, the microprocessor 22 obtains battery cell parameters relating to the quality of the battery cells 15 from the memory 16 in the battery pack 14. The battery cell quality parameters include the number of life cycles (total number of charge/discharge cycles) and the quantity of charging cycles (total number of charge/discharge cycles since the most recent conditioning cycle) of each cell in the pack. Based on the battery cell quality parameters, the microprocessor rates the battery cell quality pack on a scale, for example, good, fair or poor quality.

At step 52, the microprocessor 22 obtains a desired device warning time, that is, the expected device operating time between $V_{lowbatt}$ and $V_{failure}$ conditions when the device 7 is being used at an "average" power use or consumption rate. Prior to using the device 7, the operator will input a desired time $V_{lowbatt}$ and $V_{failure}$ conditions in terms of minutes via the keypad 10. Alternately, the operator may be given a predetermined selection of, for example, three desired times (5 minutes, 10 minutes, and 15 minutes) and may select one of the three by pressing one of three time selection keypad keys. The desired warning time may be input by the operator via a keypad or keyboard or it may be calculated based on a predetermined value set by management and stored in the memory 40.

At step 54, the microprocessor 22 obtains a digital value representative of the current temperature of the battery cells in the battery pack 14 utilizing the temperature sensing circuitry 17. Step 56 represents calculation of the power consumption rate. characteristics. That is, based on a past period of usage of the device 7, the microprocessor 22 can calculate an average power consumption rate. Alternately, two or more power consumption rates may be stored in memory 40 by the manufacturer. The power consumption rates would correspond to the manufacturer's estimate of power consumption based on different modes of using the device 7.

For example, using the device 7 in a dataform reading mode using the dataform reading assembly and using communications circuitry of the device to transmit decoded dataform data to a remote device would correspond to a high rate of power consumption, using the device to enter data via the interactive display screen 11 would correspond to a medium rate of power consumption, while using the device to enter data via the keypad 10 and not using the communications circuitry would correspond to a low rate of power. Before beginning a new work session or when a change in usage mode of the device 7 occurred, the operator would press a key on the keypad 10 to indicate the present mode of usage of the device 7. The microprocessor 22 would then retrieve the corresponding power consumption rate from memory 40.

Step 58 represents the microprocessor's determination of the $V_{lowbatt}$ and $V_{failure}$ set point voltage values utilizing an empirically derived look up table stored in the memory 40. A simplified look up table 70 is illustrated in FIG. 5. Values for $V_{lowbatt}$ and $V_{failure}$ in volts are found in columns 72, 74 respectively. For the present usage of the device 7, the microprocessor 22 finds the input variable combination of desired warning time (column 76), battery cell temperature (column 78), battery cell quality (column 80) and expected power consumption rate (column 82) in the table 70 and then reads the corresponding current $V_{lowbatt}$ and $V_{failure}$ set point voltage values.

It should be recognized that the $V_{lowbatt}$ and $V_{failure}$ are dynamic values that will change as one or more of the input variables change during operation, e.g., mode of usage of the device 7 changes, battery cell temperature changes, battery cell quality decreases or the operator inputs a different desired warning time. It should also be recognized that the table 70 represents a simplified table, with each of the input variable being limited to three discrete values for ease of presentation and understanding. One skilled in the art will appreciate that a more complex table would normally be employed with more than three values for each input variable being used.

At step 60, the monitoring circuitry 12 continuously monitors whether a power failure condition has occurred, that is, whether $V_{batt} < V_{failure}$. If a power failure condition is determined by the second comparator 31, at step 62, the second comparator 31 changes output state 33 and causes the selected electronic systems 37 coupled to the D flip-flops 34, 35 and the first and second switches 36, 39 to be turned off as the device 7 enters the power saving suspend mode. Since the output 33 of the second comparator 31 is also coupled to the microprocessor 22, at step 63, the microprocessor will execute code relating to suspending operations of the device 7 by performing other functions in accord with instructions in the executed code to further reduce power consumption including, for example, reducing its own power consumption by operating at a reduced level. This step ends the process. Replacing or recharging the battery pack 14 (FIG. 3) and resuming from the suspend mode restarts the process.

Concurrently with continuously checking to determine if a power failure condition exists, the monitoring circuitry 12 also continuously monitors, at step 64, if a low battery pack output voltage condition has occurred, that is, whether $V_{batt} < V_{lowbatt}$. If a low pack battery output voltage condition has occurred, at step 66, the microprocessor 22 actuates the LED 49 as discussed above. If a low battery pack output voltage condition has not occurred, the process both loops back to step 64 to continue to monitor for a low battery pack output voltage condition and returns to step 50 where the $V_{lowbatt}$ and $V_{failure}$ set point voltage values by the microprocessor 22 if one or more of the input variables have changed.

Figure 6:
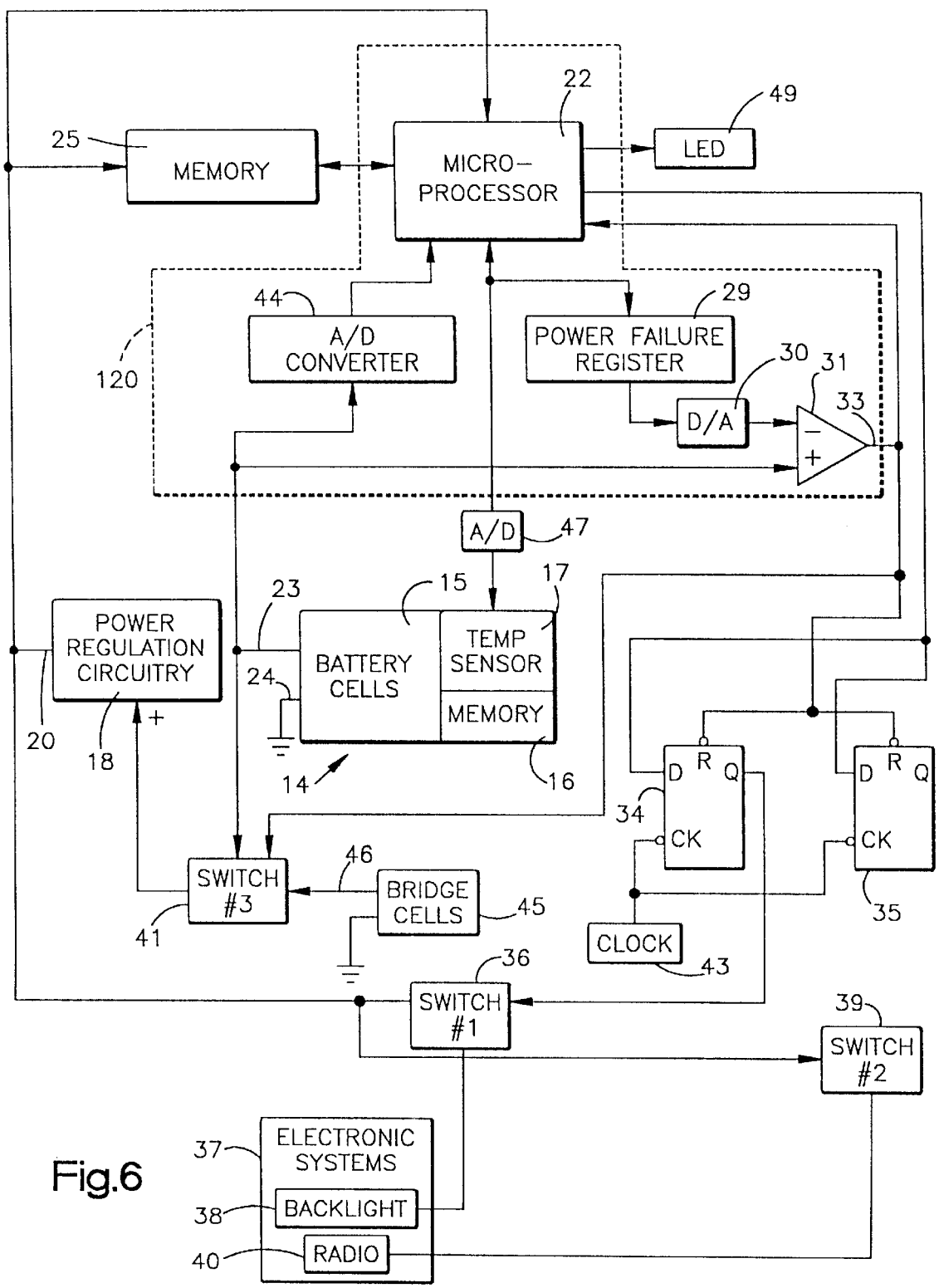
FIG. 6 is a schematic block diagram of an alternate embodiment of the low voltage battery pack monitoring circuit of the present invention.

An alternate embodiment of the monitoring circuit of the present invention is shown in FIG. 6 at 120. This embodiment is especially suitable where the portable data collection device 7 includes a disk drive. For simplicity, components and circuitry shown in FIG. 6 that are the same as the components and circuitry described with respect to the first embodiment of the monitoring circuit 12 have been assigned the same reference numerals. A first or low battery pack voltage comparison circuit is different than the comparison circuit in the first embodiment in that the first comparison circuit in the second embodiment does not include a comparator, a low battery register or a D/A converter. Instead, the first comparison circuit utilizes the microprocessor 22 to make the comparison of $V_{batt}$ and $V_{lowbatt}$.

The first comparison circuit comprises an analog to digital (A/D) converter 44 and the microprocessor 22. The A/D converter 44 has an input coupled to the positive battery pack terminal 23. Thus, the A/D converter receives as inputs an analog value of $V_{batt}$ and a ground signal (zero volts). The A/D converter 44 determines the difference between the two inputs which is, of course, $V_{batt}$, digitizes the $V_{batt}$ value and outputs the digitized value to the microprocessor 22. The microprocessor 22 compares digital values of $V_{batt}$ and $V_{lowbatt}$ to determine if $V_{batt} < V_{lowbatt}$. If the microprocessor 22 determines a low battery pack output condition has occurred, it will execute code to actuate the LED 49 for a predetermined time and flash a low battery pack output voltage message of the display screen 11 for a predetermined time.

A second or power failure comparison circuit of the monitoring circuit 120 is identical to the second comparison circuit of the monitoring circuit 12 of the first embodiment. However, in this embodiment, it is assumed that the device 7 includes one or more bridge cells 45 which have sufficient power to run all the electronic systems of the device for a limited time to allow for an orderly shutdown of complex devices such as a disk drive by the microprocessor 22. The output 33 of the second or power failure comparator 31 goes low when a power failure condition occurs, $V_{batt} < V_{failure}$. The second comparator output 33 is coupled to a third switch 41 which is coupled to the power regulation circuitry 18 and positive terminals 23, 46 of the battery pack 14 and the bridge cells 45. When the output 33 of the second comparator 31 is high (no power failure condition), the third switch 41 electrically couples the battery pack 14 to the power regulation circuitry 18 and the bridge cells 45 are disconnected from the power regulation circuitry. When a power failure condition is sensed and the second comparator output 33 goes low, the third switch 41 electrically couples the bridge cells 45 to the power regulation circuitry 18 and disconnects the battery pack 14 from the power regulation circuitry. The bridge cells 45 provide sufficient power to permit an orderly shut down of electronic systems such as a disk drive by the microprocessor 22. The backlight 38 and radio transceiver 40 are turned off by the first and second D flip-flops 34, 35 and the first and second switches 36, 39 as described with respect to the first embodiment of the monitoring circuit.

While the present invention has been described with a degree of particularity, it is the intent that the invention include all modifications and alterations from the disclosed design falling within the spirit and scope of the appended claims.

We claim:

1. A battery pack monitoring circuit for a portable electronic device having a battery pack, electronic circuitry including a microprocessor and a plurality of electronic systems, the monitoring circuit comprising:
   a) a first comparison circuit for comparing a low battery pack set point voltage value to an output voltage across the battery pack and generating a signal resulting in actuation of a low battery indicator upon the battery pack output voltage falling below the low battery set point voltage value; and
   b) a second comparison circuit including a power failure comparator having an output with two output states, the comparator electrically coupled to the battery pack for comparing a power failure set point voltage value to the output voltage across the battery pack, the comparator output changing from a first output state to a second output state upon the battery pack output voltage falling below the power failure set point voltage value, at least one of the electronic systems of the device coupled to the output of the comparator and being turned off upon the comparator output changing to the second output state, at least one of the low battery set point voltage value and the power failure set point voltage value being a dynamic value that changes in response to changes in one or more operating conditions of the portable electronic device and the battery pack.

2. The monitoring circuit of claim 1 wherein the operating conditions of the portable electronic device and the battery pack including at least one of the following:
   i) mode of usage of the portable electronic device;
   ii) a temperature of the battery pack; and
   iii) a quality of the battery cell.

3. A battery pack monitoring circuit for a portable electronic device having a battery pack, electronic circuitry including a microprocessor and a plurality of electronic systems, the monitoring circuit comprising:
   a) a first comparison circuit for comparing a low battery pack set point voltage value to an output voltage across the battery pack and generating a signal resulting in actuation of a low battery indicator upon the battery pack output voltage falling below the low battery set point voltage value;
   b) a second comparison circuit including a power failure comparator having an output with two output states, the comparator electrically coupled to the battery pack for comparing a power failure set point voltage value to the output voltage across the battery pack, the comparator output changing from a first output state to a second output state upon the battery pack output voltage falling below the power failure set point voltage value, at least one of the electronic systems of the device coupled to the output of the comparator and being turned off upon the comparator output changing to the second output state; and
   c) the second comparison circuit including a D flip-flop and a switch coupled between the output of the power failure comparator and the at least one of the electronic systems of the device, an output of the D flip-flop changing state when the power failure comparator changes from the first output state to second output state causing the switch to change state and turn off the at least one of the electronic systems.

4. The monitoring circuit of claim 3 wherein the output of the comparator is coupled to a reset input of the D flip flop.

5. The monitoring circuit of claim 3 wherein the first comparison circuit includes an analog to digital converter electrically coupled to the microprocessor, the analog to digital converter electrically coupled to the battery pack and providing a digitized representation of the battery pack output voltage to the microprocessor, the microprocessor comparing the battery pack output voltage to the low battery set point voltage value and generating the signal resulting in actuation of the low battery indicator upon the battery pack output voltage falling below the and the low battery set point voltage value.

6. The monitoring circuit of claim 3 where the first comparison circuit includes a low battery comparator having an output with two output states and being electrically coupled to the battery pack, the comparator output changing from a first output state to a second output state upon the battery pack output voltage falling below the low battery set point voltage value, the microprocessor coupled to the output of the first comparator and the microprocessor generating the signal resulting in actuation of the low battery indicator upon the comparator output changing from the first output state to the second output state to the a first to second output state.

7. The monitoring circuit of claim 6 wherein the first comparison circuit further includes a first register electrically coupled to the low battery comparator, the low battery pack set point voltage value stored in the first register and coupled to a noninverting input of the low battery comparator and a second register electrically coupled to the power failure comparator, the power failure set point voltage value stored in the second register and coupled to an inverting input of the power failure comparator.

8. The monitoring circuit of claim 7 wherein a first digital to analog converter is electrically coupled between the first register and the low battery comparator, a digital representation of the low battery pack set point voltage value is stored in the first register and converted to an analog representation of the low battery pack set point voltage value by the first digital to analog converter prior to input to the noninverting input of the low battery comparator.

9. The monitoring circuit of claim 8 wherein a second digital to analog converter is electrically coupled between the second register and the power failure comparator, a digital representation of the power failure set point voltage value is stored in the second register and converted to an analog representation of the power failure set point voltage value by the second digital to analog converter prior to input to the inverting input of the power failure comparator.

10. A battery pack monitoring circuit for a portable electronic device having a battery pack electronic circuitry including a microprocessor and a plurality of electronic systems, the monitoring circuit comprising:
   a) a first comparison circuit for comparing a low battery pack set point voltage value to an output voltage across the battery pack and generating a signal resulting in actuation of a low battery indicator upon the battery pack output voltage falling below the low battery set point voltage value;
   b) a second comparison circuit including a power failure comparator having an output with two output states, the comparator electrically coupled to the battery pack for comparing a power failure set point voltage value to the output voltage across the battery pack, the comparator output chanting from a first output state to a second output state upon the battery pack output voltage falling below the power failure set point voltage value, at least one of the electronic systems of the device coupled to the output of the comparator and being turned off upon the comparator output changing to the second output state; and c) the low battery pack set point voltage value and the power failure set point voltage value being determined from an empirical look up table.

11. The monitoring circuit of claim 10 wherein the empirical look table provides specific values for the low battery pack set point voltage value and the power failure set point voltage value as a function of a measure of quality of battery cells comprising the battery pack, a specified operating time of the device between the low battery pack set point voltage value and the power failure set point voltage value, a value of a cell temperature of the battery pack battery, and a power consumption rate of the device.

12. A battery pack monitoring circuit for a portable electronic device having a battery pack, electronic circuitry including a microprocessor and a plurality of electronic systems, the monitoring circuit comprising:

a) a power failure comparison circuit including a power failure comparator having an output and being electrically coupled to the battery pack for comparing a power failure set point voltage value to the output voltage across the battery pack; and b) the power failure comparator output changing output states upon the battery pack output voltage falling below the power failure set point voltage value, at least one of the electronic systems of the device coupled to the output of the power failure comparison circuit and being turned off upon the power failure comparator changing output states, the power failure set point voltage value being a dynamic value that varies with changes in one or more operating conditions of the portable electronic device and the battery pack.

13. A battery pack monitoring circuit for a portable electronic device having a battery pack, electronic circuitry including a microprocessor and a plurality of electronic systems, the monitoring circuit comprising:

a) a power failure comparison circuit including a power failure comparator having an output and being electrically coupled to the battery pack for comparing a power failure set point voltage value to the output voltage across the battery pack;

b) the power failure comparator output changing output states upon the battery pack output voltage falling below the power failure set point voltage value, at least one of the electronic systems of the device coupled to the output of the power failure comparison circuit and being turned off upon the power failure comparator changing output states; and c) the power failure comparison circuit including a D flip-flop and a switch coupled between the output of the power failure comparator and the at least one of the electronic systems of the device, an output of the D flip-flop changing state when the power failure comparator changes from the first output state to second output state causing the switch to change state and turn off the at least one of the electronic systems.

14. The battery pack monitoring circuit of claim 13 wherein the monitoring circuit additionally includes a low battery comparison circuit having an output and being electrically coupled to the battery pack for comparing a low battery pack set point voltage value to an output voltage across the battery pack, the low battery comparison circuit changing output states upon the battery pack output voltage falling below the low battery set point voltage value, the microprocessor coupled to the output of the low battery comparison circuit and upon the low battery comparison circuit output changing output states generating a signal resulting in actuation of a low battery indicator.

15. The monitoring circuit of claim 14 wherein the circuit further includes a first register electrically coupled to the power failure comparison circuit, the power failure set point voltage value stored in the first register and coupled to an inverting input of the power failure comparison circuit and a second register electrically coupled to the low battery comparison circuit, the low battery set point voltage value stored in the second register and coupled to a noninverting input of the low battery comparison circuit.

16. The monitoring circuit of claim 15 wherein a first digital to analog converter is electrically coupled between the first register and the power failure comparator, a digital representation of the power failure set point voltage value is stored in the first register and converted to an analog representation of the power failure set point voltage value by the first digital to analog converter prior to input to the inverting input of the power failure comparator.

17. The monitoring circuit of claim 16 wherein a second digital to analog converter is electrically coupled between the second register and the low battery comparator, a digital representation of the low battery pack set point voltage value is stored in the second register and converted to an analog representation of the low battery pack set point voltage value by the second digital to analog converter prior to input to the noninverting input of the low battery comparator.

18. The monitoring circuit of claim 14 wherein the low battery pack set point voltage value and the power failure set point voltage value are determined from an empirical look up table.

19. The monitoring circuit of claim 18 wherein the empirical look table provides specific values for the low battery pack set point voltage value and the power failure set point voltage value as a function of a measure of quality of battery cells comprising the battery pack, a specified operating time of the device between the low battery pack set point voltage value and the power failure set point voltage value, a value of the battery pack battery cell temperature, and a power consumption rate of the device.

20. The monitoring circuit of claim 14 wherein the operating conditions of the portable electronic device and the battery pack including at least one of the following:

i) mode of usage of the portable electronic device;

ii) a temperature of the battery pack; and iii) a quality of the battery cell.

* * * * *